United States Patent
Baleine et al.

(10) Patent No.: US 9,800,803 B2
(45) Date of Patent: *Oct. 24, 2017

(54) RECONFIGURABLE PHASE CHANGE MATERIAL MASKS FOR ELECTRO-OPTICAL COMPRESSIVE SENSING

(71) Applicant: Lockheed Martin Corporation, Bethesda, MD (US)

(72) Inventors: Clara Rivero Baleine, Orlando, FL (US); Robert Muise, Oviedo, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/957,671

(22) Filed: Dec. 3, 2015

(65) Prior Publication Data
US 2016/0088242 A1 Mar. 24, 2016

Related U.S. Application Data

(63) Continuation of application No. 13/585,577, filed on Aug. 14, 2012, now Pat. No. 9,293,197.

(60) Provisional application No. 61/523,672, filed on Aug. 15, 2011.

(51) Int. Cl.
| | |
|---|---|
| *H04N 5/33* | (2006.01) |
| *G11C 13/00* | (2006.01) |
| *H01L 31/0232* | (2014.01) |
| *G02F 1/01* | (2006.01) |
| *G02F 1/03* | (2006.01) |
| *G01S 7/481* | (2006.01) |

(52) U.S. Cl.
CPC .............. *H04N 5/33* (2013.01); *G02F 1/0126* (2013.01); *G02F 1/0327* (2013.01); *G11C 13/0004* (2013.01); *H01L 31/02327* (2013.01); *G01S 7/4816* (2013.01)

(58) Field of Classification Search
CPC ................................. H04N 5/33; G02F 1/0126
See application file for complete search history.

(56) References Cited

U.S. PATENT DOCUMENTS

| | | | |
|---|---|---|---|
| 3,362,797 A | 1/1968 | Shaskolskaja et al. | |
| 3,825,317 A | 7/1974 | Inoue et al. | |
| 4,209,229 A | 6/1980 | Rittler | |

(Continued)

OTHER PUBLICATIONS

Non-Final Office Action for U.S. Appl. No. 14/518,106, mailed Jul. 29, 2016, 13 pages.

(Continued)

*Primary Examiner* — Casey Bryant
(74) *Attorney, Agent, or Firm* — Withrow & Terranova, PLLC

(57) ABSTRACT

An optical system that includes a reconfigurable phase-change material (PCM) layer that includes a plurality of individually controllable pixel areas. Each individually controllable pixel area is variable between a first refractive index and a second refractive index. The PCM layer is configured to pass radiation incident on the PCM layer in accordance with a first mask pattern through the PCM layer in a downstream direction. A PCM controller is configured to control the plurality of individually controllable pixel areas to have respective refractive indices in accordance with the first mask pattern.

16 Claims, 8 Drawing Sheets

(56) References Cited

U.S. PATENT DOCUMENTS

| | | |
|---|---|---|
| 4,635,082 A | 1/1987 | Domoto et al. |
| 4,867,544 A | 9/1989 | Bornstein et al. |
| 5,102,694 A | 4/1992 | Taylor et al. |
| 5,166,827 A | 11/1992 | Noda |
| 5,171,344 A | 12/1992 | Noda |
| 5,200,858 A | 4/1993 | Hagerty et al. |
| 5,236,486 A | 8/1993 | Blankenbecler et al. |
| 5,245,328 A | 9/1993 | Garrett |
| 5,254,454 A | 10/1993 | Mimiya et al. |
| 5,262,896 A | 11/1993 | Blankenbecler |
| 5,294,240 A | 3/1994 | Sanghera et al. |
| 5,336,643 A | 8/1994 | Goto et al. |
| 5,349,473 A | 9/1994 | Kurasawa et al. |
| 5,448,409 A | 9/1995 | Noda |
| 5,459,613 A | 10/1995 | Xu |
| 5,537,505 A | 7/1996 | Borrelli et al. |
| 5,608,568 A | 3/1997 | Blodgett et al. |
| 5,731,906 A | 3/1998 | Morita |
| 5,796,525 A | 8/1998 | Dempewolf et al. |
| 5,867,264 A | 2/1999 | Hinnrichs |
| 5,917,105 A | 6/1999 | Xu et al. |
| 6,027,672 A | 2/2000 | Weitzel et al. |
| 6,236,493 B1 | 5/2001 | Schmidt et al. |
| 6,362,118 B1 | 3/2002 | Beall et al. |
| 6,519,975 B1 | 2/2003 | Bange et al. |
| 6,570,784 B2 | 5/2003 | Lowrey |
| 6,586,474 B2 | 7/2003 | Webber et al. |
| 6,586,761 B2 | 7/2003 | Lowrey |
| 6,673,497 B2 | 1/2004 | Efimov et al. |
| 6,687,153 B2 | 2/2004 | Lowrey |
| 6,819,469 B1* | 11/2004 | Koba ............... G03F 7/70291 359/290 |
| 6,908,812 B2 | 6/2005 | Lowrey |
| 6,959,753 B1 | 11/2005 | Weber et al. |
| 7,005,665 B2 | 2/2006 | Furkay et al. |
| 7,119,353 B2 | 10/2006 | Lankhorst et al. |
| 7,148,164 B2 | 12/2006 | Minamikawa et al. |
| 7,164,818 B2 | 1/2007 | Bryan et al. |
| 7,173,767 B2 | 2/2007 | Satzke |
| 7,208,133 B2 | 4/2007 | Cho et al. |
| 7,315,683 B2 | 1/2008 | Beall et al. |
| 7,326,500 B1 | 2/2008 | Glebov et al. |
| 7,405,883 B2 | 7/2008 | Hashimoto |
| 7,501,648 B2 | 3/2009 | Chen et al. |
| 7,570,432 B1 | 8/2009 | Yonak |
| 7,687,871 B2 | 3/2010 | Maimon |
| 7,800,095 B2 | 9/2010 | An et al. |
| 7,880,194 B2 | 2/2011 | Breitwisch et al. |
| 8,120,770 B2 | 2/2012 | Huang et al. |
| 8,178,387 B2 | 5/2012 | Cheng et al. |
| 8,306,786 B1 | 11/2012 | Lynch et al. |
| 2002/0022564 A1 | 2/2002 | Minamikawa et al. |
| 2002/0088952 A1 | 7/2002 | Rao et al. |
| 2004/0114204 A1 | 6/2004 | Klug et al. |
| 2005/0030784 A1 | 2/2005 | Johnson |
| 2005/0032623 A1 | 2/2005 | Araujo et al. |
| 2005/0137075 A1 | 6/2005 | Messerschmidt et al. |
| 2006/0051047 A1 | 3/2006 | Beall et al. |
| 2006/0068154 A1 | 3/2006 | Parce et al. |
| 2006/0097342 A1 | 5/2006 | Parkinson |
| 2006/0135341 A1 | 6/2006 | Ellison et al. |
| 2007/0045771 A1 | 3/2007 | Philipp et al. |
| 2007/0093373 A1 | 4/2007 | Borrelli et al. |
| 2007/0116409 A1 | 5/2007 | Bryan et al. |
| 2007/0181867 A1 | 8/2007 | Hewak et al. |
| 2008/0192331 A1* | 8/2008 | Wang ............... B82Y 20/00 359/315 |
| 2009/0236079 A1 | 9/2009 | Khodadadi |
| 2011/0013287 A1 | 1/2011 | Huang et al. |
| 2011/0266445 A1 | 11/2011 | Beratan |
| 2011/0293942 A1 | 12/2011 | Cornejo et al. |
| 2012/0127562 A1 | 5/2012 | Kim et al. |
| 2012/0213270 A1 | 8/2012 | Baraniuk et al. |
| 2013/0043375 A1 | 2/2013 | Baleine et al. |
| 2013/0314765 A1* | 11/2013 | Padilla ............... G01K 7/003 359/315 |
| 2014/0378818 A1 | 12/2014 | Drake et al. |
| 2015/0177426 A1 | 6/2015 | Sakoske et al. |
| 2016/0238746 A1 | 8/2016 | Baleine et al. |

OTHER PUBLICATIONS

Siegel, J. et al., "Rewritable phase-change optical recording in $Ge_2Sb_2Te_5$ films induced by picosecond laser pulses," Applied Physics Letters, vol. 84, Issue 13, Mar. 29, 2004, American Institute of Physics, 4 pages.

Non-Final Office Action for U.S. Appl. No. 13/585,577, mailed Feb. 9, 2015, 12 pages.

Final Office Action for U.S. Appl. No. 13/585,577, mailed May 26, 2015, 10 pages.

Notice of Allowance for U.S. Appl. No. 13/585,577, mailed Aug. 20, 2015, 8 pages.

Non-Final Office Action for U.S. Appl. No. 14/172,175, mailed Jul. 28, 2015, 11 pages.

Jared, David A. et al., "Electrically addressed spatial light modulator that uses a dynamic memory," Optics Letters, vol. 16, No. 22, Nov. 15, 1991, Optical Society of America, pp. 1785-1787.

Jiang, Lijun et al., "Design, fabrication and testing of a micromachined thermo-optical light modulator based on a vanadium dioxide array," Journal of Micromechanics and Microengineering, vol. 14, No. 7, May 13, 2004, IOP Publishing Ltd., pp. 833-840.

Verleur, Hans W. et al., "Optical Properties of $VO_2$ Between 0.25 and 5 eV," Physical Review, vol. 172, No. 3, Aug. 15, 1968, pp. 788-798.

Notice of Allowance for U.S. Appl. No. 14/172,175, mailed Jan. 15, 2016, 10 pages.

Final Office Action for U.S. Appl. No. 14/518,106, mailed Jan. 26, 2017, 14 pages.

Advisory Action for U.S. Appl. No. 14/518,106, dated Apr. 13, 2017, 3 pages.

* cited by examiner

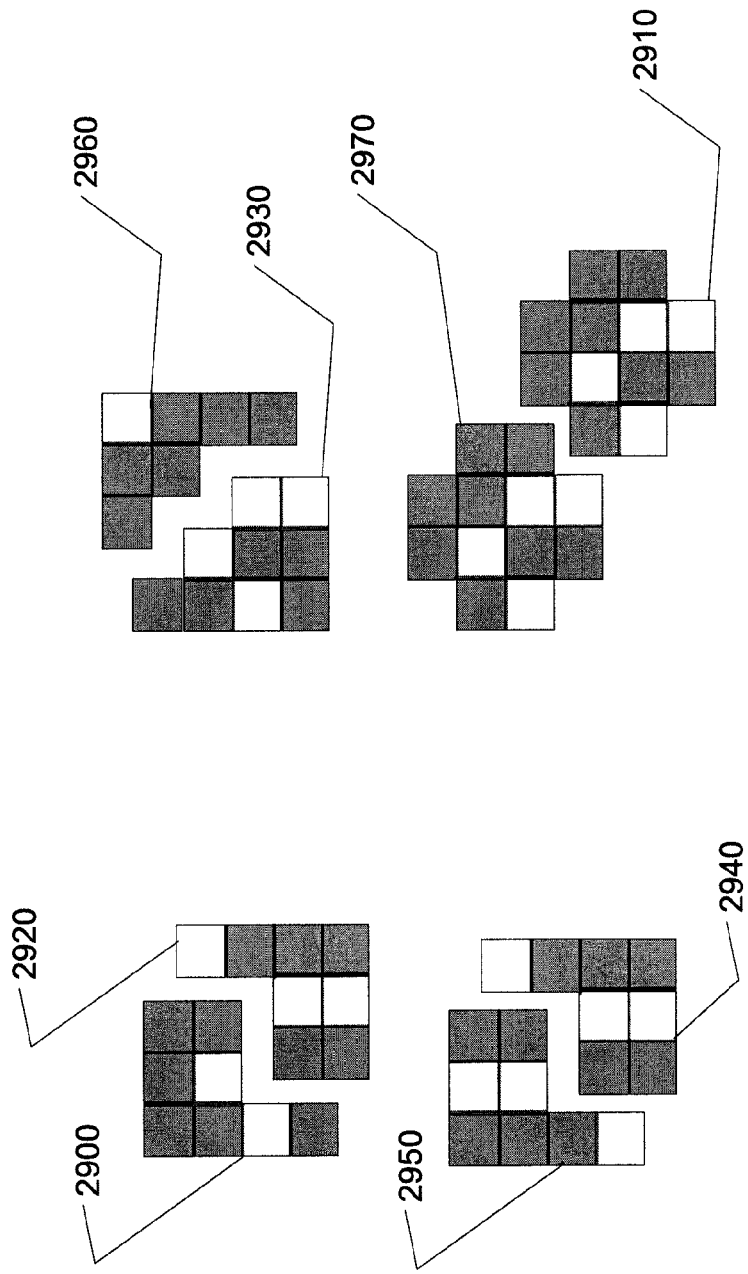

RECONFIGURABLE PHASE CHANGE MATERIAL MASKS FOR ELECTRO-OPTICAL COMPRESSIVE SENSING

PRIORITY

This application is a continuation of co-pending U.S. patent application Ser. No. 13/585,577, filed on Aug. 14, 2012, entitled "RECONFIGURABLE PHASE CHANGE MATERIAL MASKS FOR ELECTRO-OPTICAL COMPRESSIVE SENSING," which claims the benefit of U.S. Provisional Patent Application No. 61/523,672, filed on Aug. 15, 2011, entitled "RECONFIGURABLE PHASE CHANGE MATERIAL MASKS FOR ELECTRO-OPTICAL COMPRESSIVE SENSING," the disclosures of which are hereby incorporated herein by reference in their entireties.

TECHNICAL BACKGROUND

A key challenge to high resolution imaging sensors used in observing terrestrial activities over a very wide field-of-view (WFOV) (e.g., 50 km$^2$) is to achieve the resolution needed to observe and make inferences regarding events and objects of interest while maintaining the area coverage, and minimizing the cost, size, weight, and power of the sensor system. One particularly promising approach to the data deluge problem is compressive sensing, which involves collecting a small amount of information-rich measurements rather than the traditional image collection from a traditional pixel-based imager.

There is no current solution for compressive sensing architectures, especially in the infrared. An eyelid technology, liquid crystal (LC), and microelectromechanical system (MEMS) digital mirror arrays (DMA) have been postulated as potential solutions in a lab environment, but there is no current hardware available. The closest technology to production scale is a visible/short wave infrared compressive sensing camera that uses the DMA array, but this is a reflective design.

A DMA solution is limited in resolution by the number of pixels and also to a± degree tilt in the reflective element(s). Also, the solution is complex and failure-prone due to the complex optics, and the sampling modulation is limited.

SUMMARY

Aspects of the techniques and solutions disclosed herein are directed at coded masks that include phase change material (PCM). Such masks may be suitable for use with various types of photo-detectors, such as photo-detectors of the type disclosed in U.S. Pat. No. 7,687,871, issued to Shimon Maimon on Mar. 30, 2010, the entire contents of which are hereby incorporated by reference. Other detector types, such as p-n junction detectors, photodiodes, charge-coupled device (CCD) photodetectors, active-pixel sensors/CMOS sensors, and other detector types. Wavelengths detected by the photodetector and/or filtered or otherwise affected by a coded PCM mask applied to the detector may include long-wave, mid-wave, and/or short-wave infra-red, millimeter-wave, visible spectrum, and/or ultra-violet radiation.

Aspects of the techniques and solutions discussed herein may pertain to a pixel-level mask for a photo-detector, the mask comprising: a layer of reconfigurable phase-change material (PCM) configured to vary between a first refractive index and a second refractive index; said PCM layer being divided into individual pixel areas such that each individual pixel area may be set to have the first refractive index or the second refractive index; said PCM layer being disposed on a photo-detector such that incident radiation detected by the photo-detector must pass through the PCM layer in order to be detected; and a PCM controller that controls the refractive index of an individual pixel area.

In some variations, each pixel area may have a refractive index within a range of values between the first refractive index and the second refractive index, inclusive. In some variations, the PCM includes Ge2Sb2Te5 (GST); the first refractive index is associated with a crystallized state of GST; and the second refractive index is associated with an amorphous state of GST.

In some variations, the PCM controller includes a voltage source; and the PCM controller is operably connected to an individual pixel area such that a first voltage level provided by the controller sets the individual pixel area to have the first refractive index and a second voltage level provided by the controller sets the individual pixel area to have the second refractive index.

In some variations, the mask includes a voltage source operably connected to the PCM controller; the PCM controller includes a multiplexer PCM controller; and the PCM controller controls the voltage source such that the voltage source provides a first voltage level that sets an individual pixel area to have the first refractive index and such that the voltage source provides a second voltage level that sets the individual pixel area to have the second refractive index. In some variations, the first voltage level is six volts.

In some variations, the individual pixel areas are aggregated into superpixels. In some variations, the superpixels are controlled by the PCM controller such that each superpixel may be set to have a particular imaging mask pattern by changing the refractive indices of the pixel areas within each superpixel. In some variations, each superpixel in the mask is the same size and shape. In some variations, a superpixel corresponds to a pixel of the underlying photo-detector.

In some variations, the mask includes a laser source; the PCM controller is operably connected to the laser source; the laser source provides a first laser irradiation to the individual pixel area to set the individual pixel area to the first refractive index and a second laser irradiation to the individual pixel area to set the individual pixel area to the second refractive index. In some variations, the first laser irradiation is continuous wave (CW) irradiation and the second laser irradiation is pulsed irradiation.

In some variations, the photo-detector is an infra-red detector; the superpixels the PCM layer correspond to pixel areas of the infra-red detector; the pixel areas having the first refractive index are opaque to infra-red radiation; and the pixel areas having the second refractive index are transparent to infra-red radiation. In some variations, the pixel areas having the first refractive index and the pixel areas having the second refractive index are arranged to form an imaging mask for compressive imaging.

In some variations, the mask includes an index variation layer of ZnS-SiO2 disposed beneath the PCM layer; a layer of Aluminum disposed beneath the response variation layer; and a layer of glass disposed beneath the layer of Aluminum; where the photo-detector is disposed beneath the layer of glass such that incoming radiation to be detected by the photo-detector must pass through the PCM layer, the index variation layer, the Aluminum, and the glass before being detected by the photo-detector.

In some variations, the mask includes a layer of doped silicon and/or alumina disposed beneath the PCM layer, where switching properties of the mask are determined based on a thickness of the doped silicon and/or alumina layers.

In some variations, the PCM controller controls a pattern of the imaging mask by selectively changing refractive indexes of individual pixel areas.

In some variations, PCM controller includes a laser source; the laser source providing a first laser irradiation to the individual pixel area to set the individual pixel area to the first refractive index; and the laser source providing a second laser irradiation to the individual pixel area to set the individual pixel area to the second refractive index.

Aspects of the techniques and solutions discussed herein may pertain to method of controlling the absoption of individual pixel areas in a reconfigurable phase-change material (PCM) mask for a photo-detector, the method comprising: first illuminating at least one pixel area with a continuous wave (CW) laser illumination to increase the absorption of said at least one pixel area from a first value up to a second value; and second illuminating said at least one pixel area with a pulsed laser illumination to set the absorption of said at least one pixel area to the first value; where said first illuminating and said second illuminating are performed selectively on individual pixel areas in the PCM mask to set a mask pattern.

Aspects of the techniques and solutions discussed herein may pertain to a method of controlling the absoption of individual pixel areas in a reconfigurable phase-change material (PCM) mask for a photo-detector, the method comprising: first providing at least one pixel area with a SET voltage level to increase the absorption of said at least one pixel area from a first value up to a second value; and second providing said at least one pixel area with a RESET voltage level to set the absorption of said at least one pixel area to the first value; where said first providing and said second providing are performed selectively on individual pixel areas in the PCM mask to set a mask pattern.

Further scope of applicability of the techniques, devices, and solutions described herein will become apparent from the detailed description given hereinafter. However, it should be understood that the detailed description and specific examples, while indicating preferred embodiments of the techniques, devices, and solutions described herein, are given by way of illustration only, since various changes and modifications within the spirit and scope of the disclosure will become apparent to those skilled in the art from this detailed description.

BRIEF DESCRIPTION OF DRAWINGS

The techniques, devices, and solutions described herein will become more fully understood from the detailed description given herein below and the accompanying drawings which are given by way of illustration only, and thus are not limitative of the present disclosure, and wherein

FIG. 2b depicts a variation of a PCM coded mask as described herein;

The drawings will be described in detail in the course of the detailed description.

DETAILED DESCRIPTION

The following detailed description of the invention refers to the accompanying drawings. The same reference numbers in different drawings identify the same or similar elements. Also, the following detailed description does not limit the techniques, devices, and solutions described herein. Instead, the scope of the techniques, devices, and solutions described herein is defined by the appended claims and equivalents thereof.

In a solution to the above-noted problem, phase change materials (PCM) may be used as the active components to create coded apertures (i.e. sub-pixel/sub-wavelength patterns), which in, combination with image read-out and processing algorithms, optimize the "best" possible compressible image that fits the observed measurements for perfect image reconstruction.

Figure 1A:
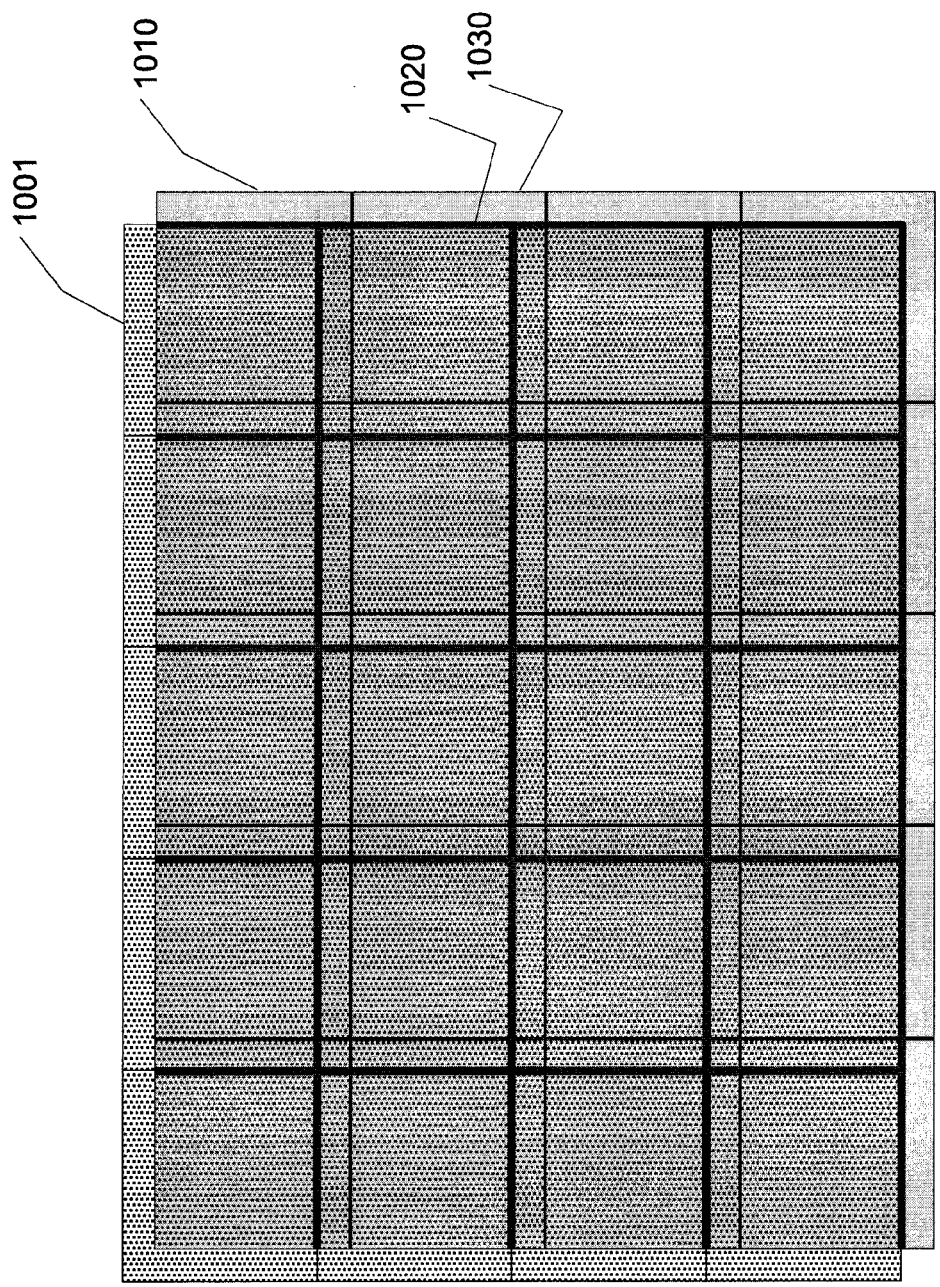
FIG. 1a depicts a variation of a PCM coded mask as described herein.

In some variations, a PCM coded mask may be disposed onto a focal plane array (FPA) such as an infra-red (IR) detector. Other variations may use different types of detectors, such as detectors that operate in some or all of the visible, millimeter-wave, and infra-red spectra. A variation of a PCM coded mask disposed over a pixel array is shown in FIG. 1a.

In the variation shown, a pixel array 1001 such as an FPA may include several individual pixels 1020. A PCM coded mask 1010 may be disposed over the FPA 1001. In some variations, the PCM coded mask may include several mask PCM elements 1030. In some variations, many mask PCM elements 1030 may cover one FPA pixel 1020. In other variations, a PCM coded mask may be a continuous surface configured for sub-pixel variations in mask structure.

In some variations, a PCM coded mask can be used in the Fourier planes as well as in the image plane. In such variations, the PCM coded mask will result in the detection of the image convolved with the PCM mask. For applications in compressive sensing, this would be particularly useful for image sparse images (i.e. imaging objects of interest against a bland background).

Figure 1B:
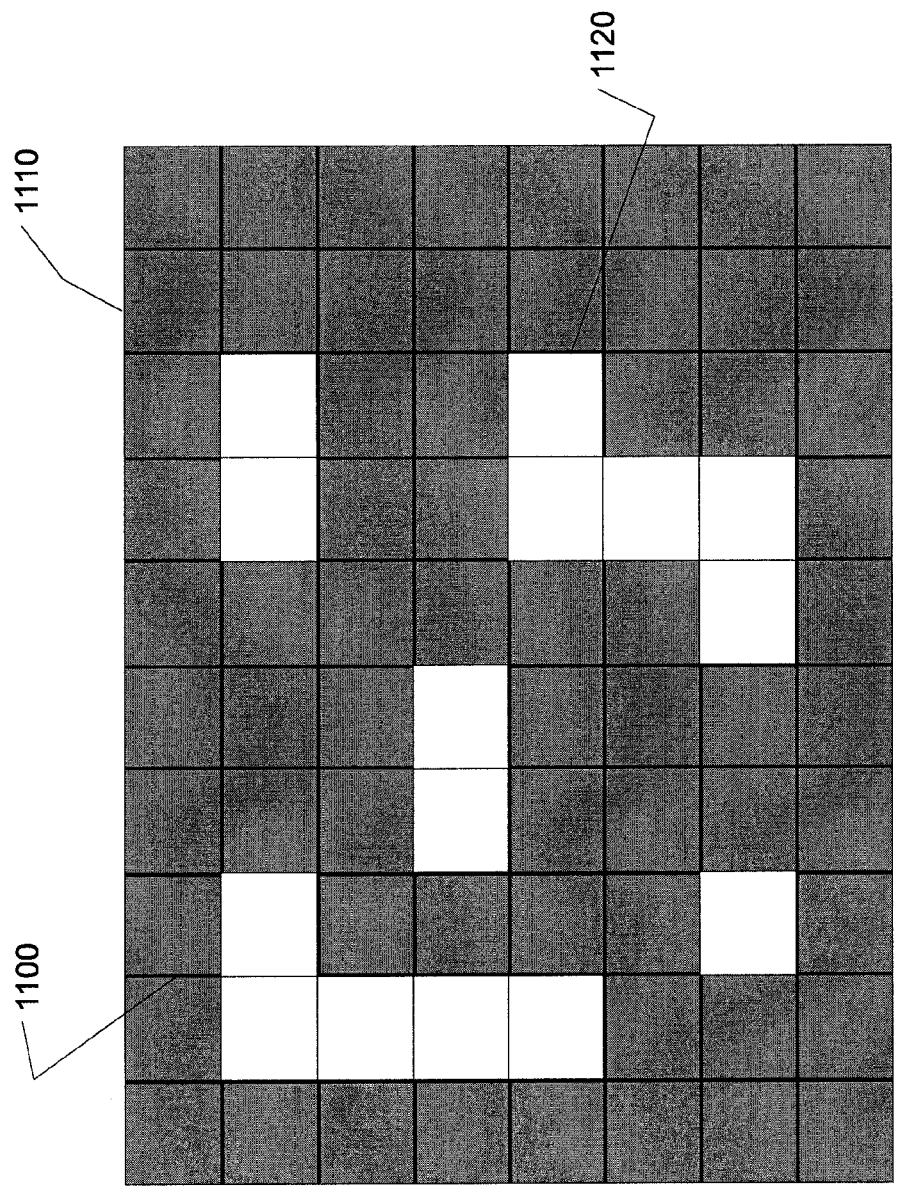
FIG. 1b depicts a variation of a PCM coded mask as described herein.

In some variations, a PCM coded mask may be used to generate one or more masks for compressive sensing applications. Such a variation of a mask is shown in FIG. 1b. In the variation shown, a PCM film 1110 may be divided into discrete regions 1100, 1120 which may correspond to pixels on an underlying photodetector (not shown). The film regions may then each be set or otherwise configured to have particular transmission properties. Some film regions may be set to transmit or pass 1120 a certain wavelength or wavelength range. Other film regions 1100 may be set to suppress that wavelength or wavelength range. In further variations, the suppressive regions 1100 may suppress or otherwise reject all incoming radiation that could/would otherwise be detected by an underlying photodetector. In such variations, the PCM film 1110 may be arranged into a compressive imaging mask such that only the transmissive regions 1120 of the mask allow electro-optical radiation to pass through for detection by an underlying photodetector (such as, for instance, an infra-red detector).

In some variations, a PCM film may be used in combination to other non-active materials such as alumina on a film stack, to generate masks for a compressive sensing application. In variations where the PCM coded mask elements correspond to one or more particular pixels on an underlying FPA, each individual element or array of elements in the mask (e.g. row or column) can be individually addressed by an external laser or voltage stimuli allowing the PCM material to change its transmission properties. In some variations, this is accomplished by causing the PCM material to change between crystalline and amorphous states; which in turns produces a change in the optical properties of the material (e.g. refractive index, absorption, etc). In some variations, these changes can occur in the nanosecond response time.

Figure 1C:
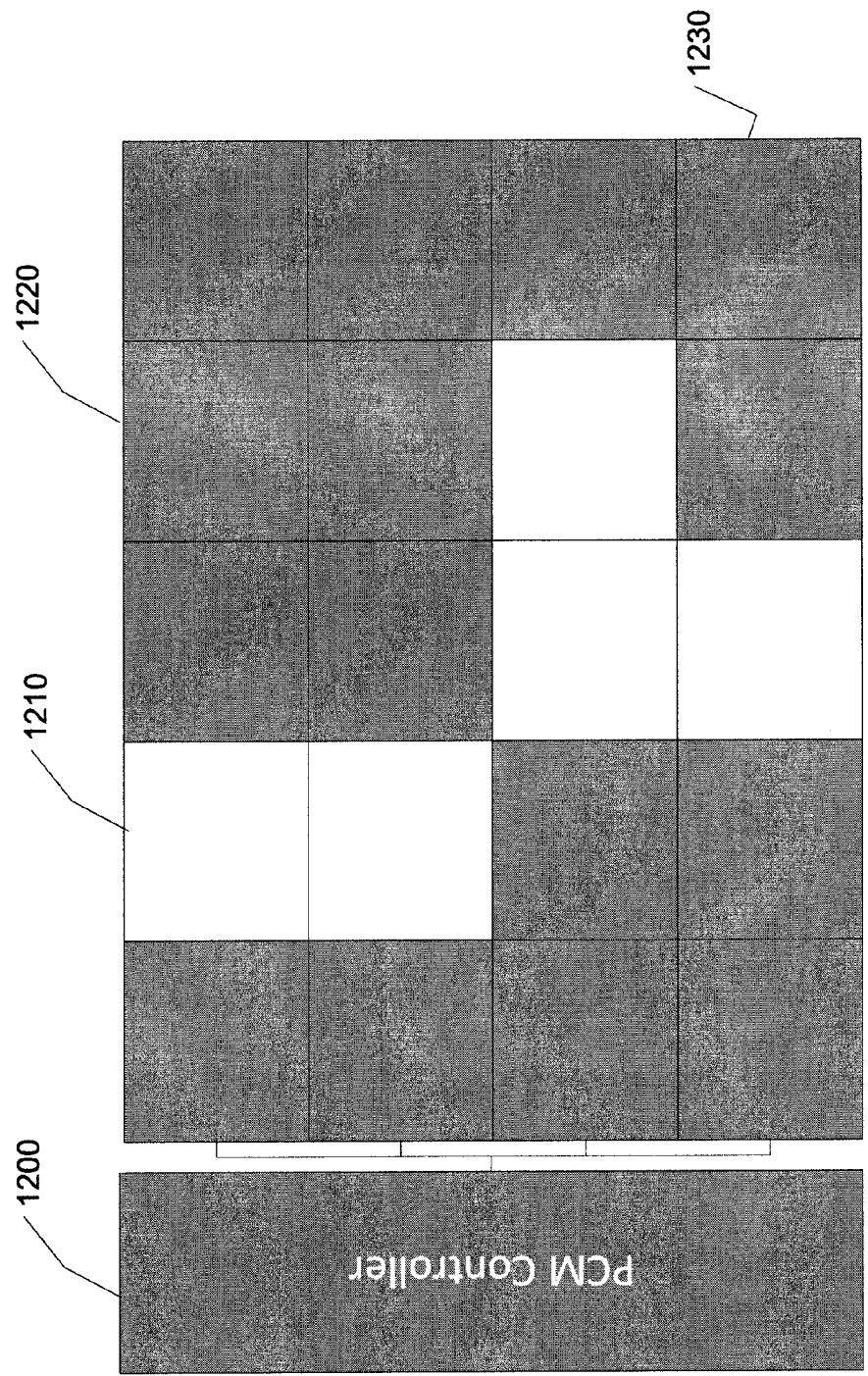
FIG. 1c depicts a variation of a PCM coded mask as described herein.

A variation of such a PCM mask is shown in FIG. 1c. In the variation shown, each element 1210, 1220 or the PCM mask 1230 corresponds to one pixel of an underlying photodetector. In the variation shown, the percentage of light transmitted through each pixel 1210, 1220 of the PCM mask 1230 can be adjusted by controlling an input voltage directed to that pixel 1210, 1220 by a multiplexer PCM controller 1200. In some variations, the application of a bias voltage (SET pulse) to a pixel 1210 crystallizes the material and a different bias (RESET), or further increasing the bias voltage, may cause the material to re-amorphize. In other variations, the PCM material may be placed in a crystalline state by a particular voltage pulse and may be triggered to change to an amorphous state by a different voltage pulse. In some variations, a SET pulse may be ~6 volts and a RESET voltage may be ~10 volts.

In some variations, the multiplexer PCM controller 1200 may be a specialized or otherwise distinct component of an overall PCM mask device. In some variations, such a multiplexer PCM controller 1200 may include a separate voltage supply source to provide the SET and RESET voltages. In the variation shown, the PCM controller 1200 is disclosed as a multiplexer that addresses the individual PCM mask elements 1210, 1220. Other variations may address the mask elements by column, by row, or may address the individual elements in non-multiplexed ways. In one variation, each mask element may have a separate signal pathway between it and a PCM controller.

Figure 1D:
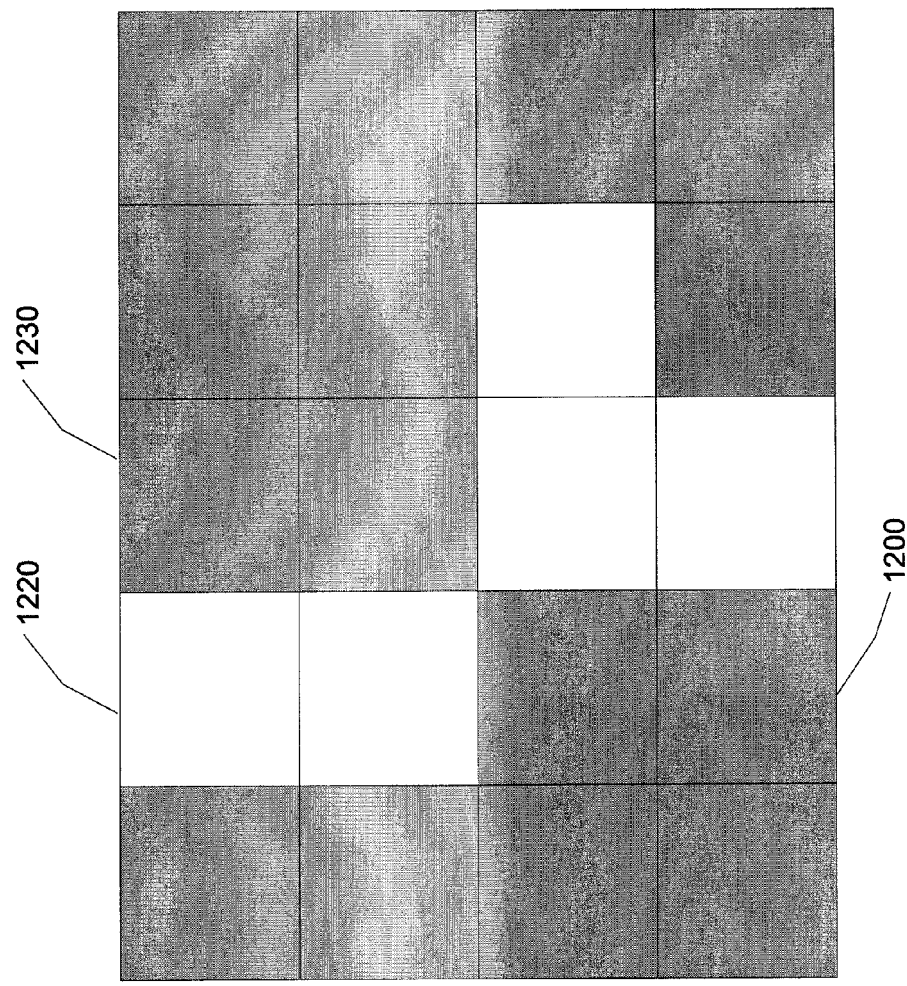
FIG. 1d depicts a variation of a PCM coded mask as described herein.
Figure 1D:
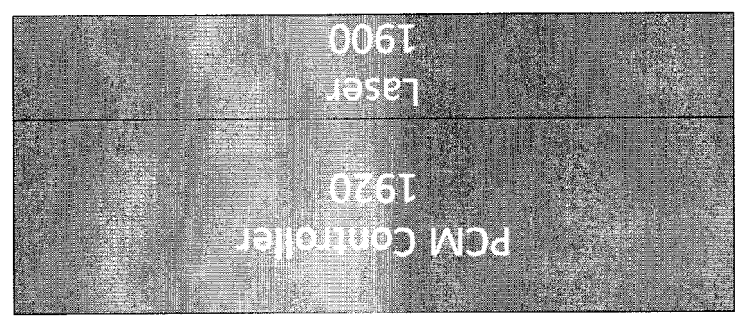

In another variation, shown in FIG. 1d, the percentage of light transmitted through each pixel 1220, 1230 of the PCM mask 1200 can be adjusted by controlling 1920 a laser power. In one variation, a CW laser 1900 crystallizes the material while a pulsed laser 1910 re-amorphizes it. In the variation shown, a PCM controller 1920 may be equipped with or connected to two different laser sources 1900, 1910. A first laser source may be a continuous wave (CW) laser 1900 whereas a second laser source 1910 may be a pulsed laser. In other variations, the PCM controller 1920 may be equipped with or connected to a single laser such as a femtosecond laser.

In some variations, reversible switching in PCM can be accomplished, in some variations, by crystallizing with a laser in CW mode and then re-amorphizing with a 40 ns pulse laser at 16 mW. Other variations may use different types or intensities of lasers to SET and RESET the PCM.

In some variations using PCM GST ($Ge_2Sb_2Te_5$) films, for example, for optical excitation, the energy density required to SET and RESET are: SET~24 mJ/cm2 and RESET~50 mJ/cm2. Molecular dynamics indicate quenching GST at $dT/dt=-15K/ps$ produces crystalline/amorphous phase transitions.

In some optically switched variations of a coded PCM mask, the mask may be equipped with multiple waveguides or optical fibers feeding each individual pixel to change their properties at adjustable laser power levels.

Figure 2A:
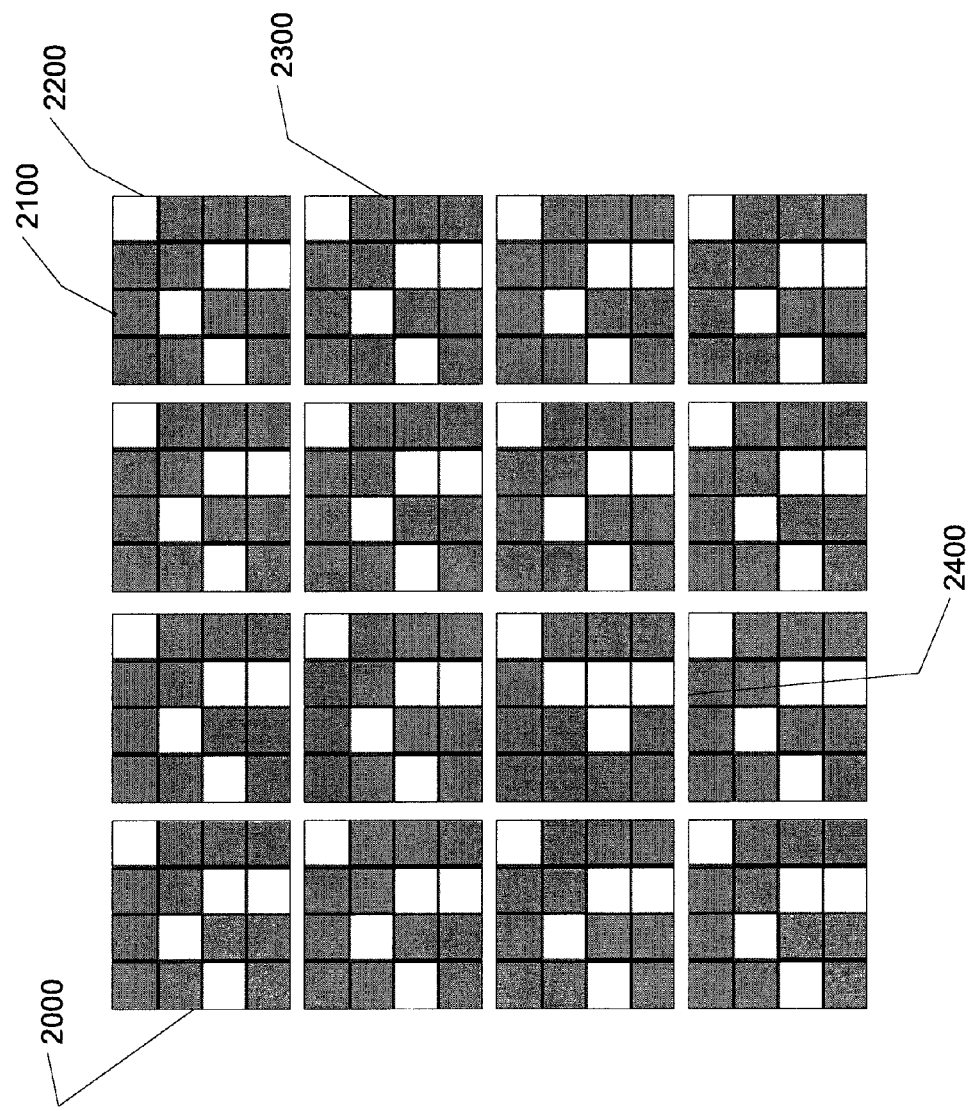
FIG. 2a depicts a variation of a PCM coded mask as described herein.

In some variations, the elements of a PCM coded mask may be smaller than the individual pixels in an FPA (focal plane array) covered by the mask. In some cases, a "superpixel" made up of smaller individual PCM coded mask elements may be coded onto one pixel of an FPA or other photodetector. In some variations, a single "pixel" of a PCM coded mask may be 10 microns or smaller. In some variations, the size of the "superpixel" may not necessarily match the pixel size of an underlying detector pixel. In some variations, the "superpixels" may be 2-dimensional arrays of PCM elements. The sizes of such arrays may match those of underlying detector pixels or may have larger or smaller sizes depending on an intended use or desired effect(s) of the PCM coded mask. Such a variation is shown in FIG. 2a.

In the variation shown, a PCM coded mask may be made up of multiple individually controllable PCM elements 2100, 220. Such PCM elements may be aggregated into "superpixels" 2000. In some variations, such PCM coded mask superpixels 2000 may be equipped with a particular pattern that establishes a transmission pattern within the superpixel 2000. In some variations, such a pattern may be repeated in some or all of the superpixels 2000, 2300. In some variations, different patterns may be applied to different superpixels 2400 in the PCM coded mask. In some variations, a superpixel in such a PCM coded mask may be controlled by a PCM controller (not shown) by setting a particular predetermine or otherwise preconfigured pattern onto the superpixel. In some such variations, the PCM controller and/or the superpixel(s) of the PCM coded mask may be equipped with one or more preconfigured or otherwise predetermined mask patterns that may be triggered by a particular signal or signal set transmitted from the PCM controller to a superpixel. In other variations, the PCM controller may address each PCM pixel element 2100, 2200 individually. In further variations, the PCM controller may optionally address a PCM superpixel 2000 to establish a particular pattern in the superpixel 2000 or address individual PCM coded mask elements 2100, 2200 to establish a particular refractive index or transmission state of that element.

In one particular variation, a coded PCM mask element may be an individually addressable square element measuring 10 microns on a side. In some variations, such individually addressable elements may be aggregated into 16×16 superpixels that each cover one detector pixel of an FPA. In some variations, the coded PCM mask may include a 512×512 array of such 16×16 superpixels. In further variations, each superpixel in such an array may be equipped or otherwise configured with a particular masking pattern.

In some variations, a superpixel 2000 may correspond to less than one pixel of an FPA. In some such variations, a group of superpixels may correspond to one or more pixels of an FPA. In other variations, a superpixel may correspond to more than one pixel of an FPA and/or have a shape or arrangement that does not overlap directly with an FPA pixel. For example, an FPA having a 30-micron pixel pitch may be covered by a coded PCM mask equipped with superpixels measuring 20 microns by 40 microns. In other variations, the superpixels may not all be the same shape. In some variations, the superpixels may not be square or rectangular. In some variations, the superpixels may have irregular shapes, such as L-shapes. Such variations are depicted in FIG. 2b.

In one variation, irregularly-shaped coded PCM mask superpixels 2900, 2920 may be configured to fit together to form a rectangular shape that may be associated with a size of one or more underlying pixels. In some variations, such superpixels 2900, 2920 may have different PCM masks. Such different masks may complement each-other or may be individually determined. In other variations, such superpixels 2950, 2940 may have the same masks.

In some variations, the PCM mask superpixels may be asymmetrically shaped 2960, 2930 and may or may not be configured to form regular shapes such as squares, rectangles, triangles, or other polyhedrons. In such variations, the mask of each superpixel 2960, 2930 may be individually established or separately controlled.

In further variations, the PCM mask superpixels may be irregular shapes such as "cross" type shapes 2970, 2910, step-sided pyramids, t-shapes, s-shapes, or other shape variations. In some variations, such superpixels 2910, 2970 may be shaped differently from each-other. In some variations, such superpixels 2910, 2970 may have different mask patterns.

Figure 3A:
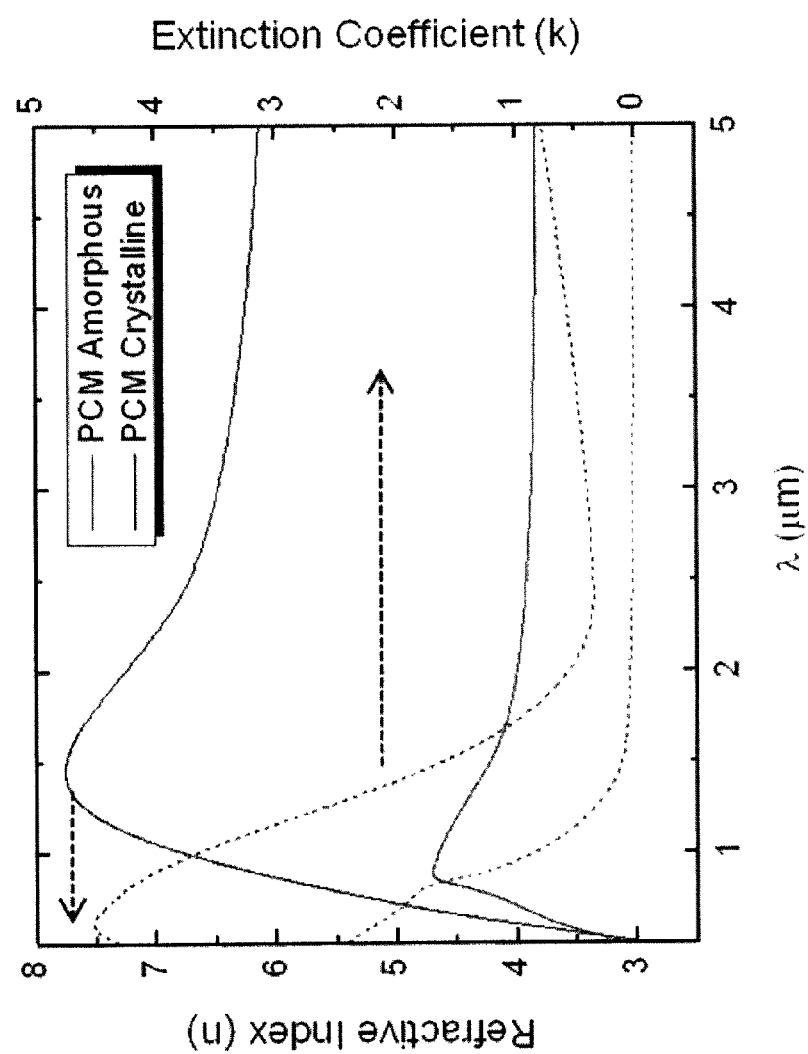
FIG. 3a depicts a variation of refraction index changes in a PCM material.

Although discussed so far with respect to only two states (transmission/absorption, or on/off), some PCM mask variations also allow for graded/scaled masking instead of just switching mask elements/pixels into "on" and "off" states. In some variations large refractive index changes (delta n~2.4) can be achieved. In some variations, refractive index can be tailored from n~3.8 in the amorphous to n~6.2 in the hexagonal crystalline via meta-stable face centered cubic transition of the material structure. FIG. 3a depicts such a range of refractive indexes for PCM GST in amorphous and crystalline states.

The graph in FIG. 3a shows the refractive index (n) and extinction coefficient (k) dispersion of $Ge_2Sb_2Te_5$ at the two extremes (amorphous and hexagonal crystalline phases). The extinction coefficient is related to the absorption. The index is shown by the solid line and the extinction coefficient by the dotted lines. As can be seen in the diagram, the refractive index of the PCM may vary based on a desired wavelength or wavelength range. In the variation shown, an index of refraction is depicted for near infra red (NIR) and mid-wave infra red (MWIR) imaging. As is shown in the diagram, for imaging wavelengths from approximately 1 to 5 microns, the amorphous PCM has an extinction coefficient of ~zero, making it essentially transparent to IR radiation. By contrast, the crystalline PCM has an extinction coefficient greater than zero, making it essentially opaque (or lossy) to IR radiation. Such variations may be realized using materials such as GST ($Ge_2Sb_2Te_5$) or other materials on the Ge-Sb-Te system or other PCM compositions Using a PCM coded mask as described herein for compressive sensing enables the optical design to be greatly simplified because there is no mechanical actuation of reflective elements and therefore a much simpler optical design. Furthermore, because the solution discussed herein operates in transmission (as compared to reflective designs using DMA) allowing for a simpler optical configuration; it does not require mechanical actuation (on/off states can be achieved by a phase transition from amorphous to crystalline state and design architecture) and can be adapted to the encoding scheme at the same spatial and/or temporal rate as the desired image/video reconstruction (it can be reconfigured/switched at nanosecond speeds using an external laser or voltage stimuli). This is so because switching times can be controlled by changing/optimizing the film structure in which the PCM layer is deposited.

Figure 3B:
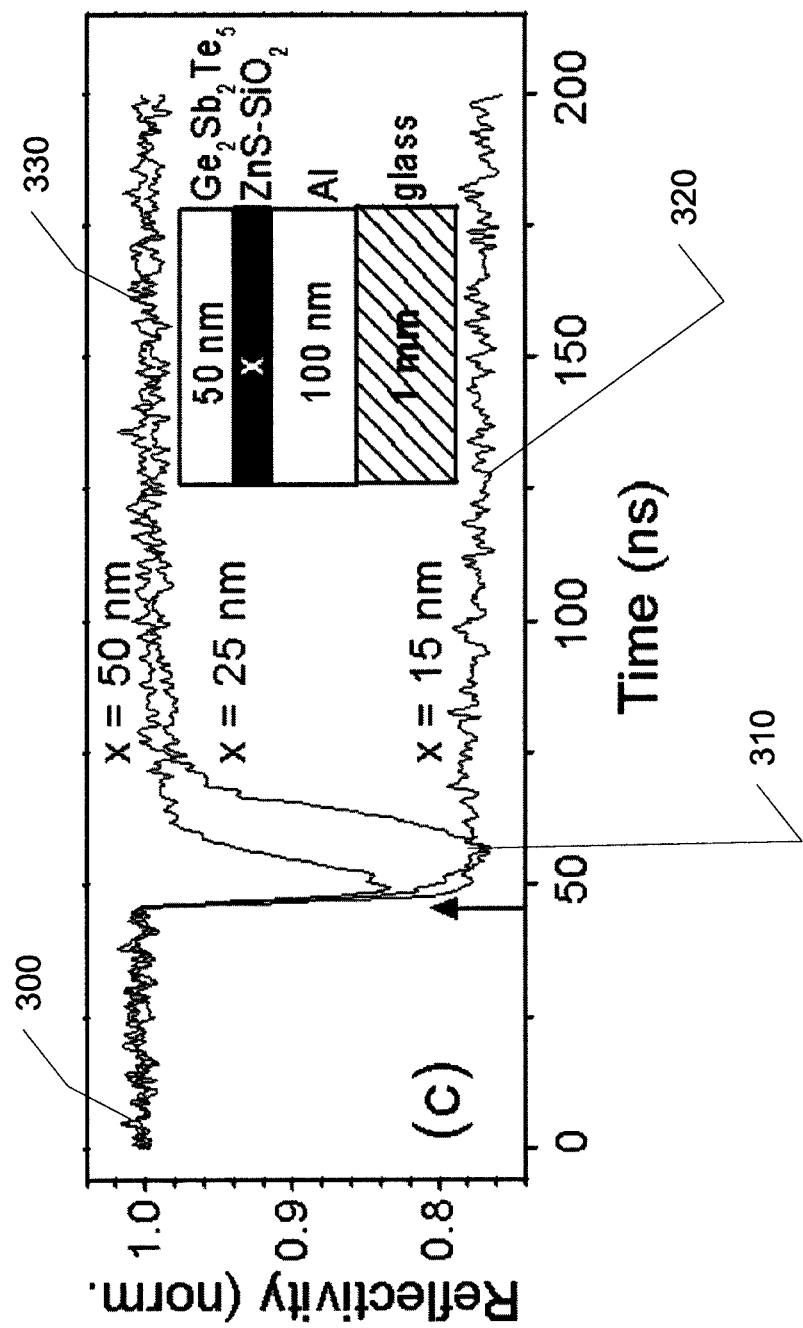
FIG. 3b depicts variations of reflectivity changes in variations of a PCM material.

FIG. 3b shows a chart indicating changes in reflectivity of an example of a PCM film stack using GST based on changes to an underlying layer of $ZnS$-$SiO_2$. As can be seen from the chart, an initially crystallized PCM region 300 may have a reflectivity normalized to 1. When amorphized by either an appropriate voltage or laser stimulus 310, the reflectivity may drop to approximately 0.8, with thicker layers of $ZnS$-$SiO_2$ being associated with a higher reflectivity. Subsequently, when re-crystallized 330, a PCM layer disposed on a thicker region of $ZnS$-$SiO_2$ recovers its reflectivity more quickly. In cases where the $ZnS$-$SiO_2$ is less than a certain thickness 320, a PCM film stack may have some difficulty in recovering an initial reflectivity. In some cases, even after a significant time period (160 nsec or more), reflectivity may not be recovered.

As can be understood from the diagram in FIG. 3b, there is flexibility in the design of a PCM coded mask architecture that can be used to optimize or otherwise configure the device properties. Although the example above depicts a particular film stack configuration using GST over $ZnS$-$SiO_2$, other materials and material combinations may be used. Similarly, although the example shown varies the thickness of the $ZnS$-$SiO_2$ to change the film stack properties, the composition of that layer (and/or other layers) and the thicknesses of other layers (such as, for instance, the GST layer) may also be altered to change the properties of the PCM film stack.

As can be seen in the diagram of FIG. 3b, switching time for changing from crystallized to amorphous and back to crystallized states can be realized in as little as ~15 nanoseconds. In some cases, amorphization may be realized in less than one nanosecond and crystallization may be realized in under 15 nanoseconds. Such fast switching time enables the creation and use of PCM coded masks for that can be reconfigured at fast switching times (few nsec as compared to millisecond for the DMA), providing the ability for better image reconstruction and quality, especially when the target object is moving.

In the variation shown, the 15 nm, 25 nm, and 50 nm thicknesses of $ZnS$-$SiO_2$ require fluences of 52 $mJ/cm^2$, 47 $mJ/cm^2$, and 31 $mJ/cm^2$, respectively, to achieve the transition from crystallized to amorphous states. Such fluence levels may be realized with nanosecond or femtosecond lasers.

Also, in the variation shown, the third layer of the PCM material stack is Aluminum. In other variations, this layer may be omitted or replaced with materials such as doped silicon or indium tin oxide (ITO). Material composition of the underlying layers of a PCM material stack may be determined based on a desired wavelength or waveband of electro-optical radiation to be detected by an underlying photodetector. Doped silicon and ITO, for example, are transparent to infra-red radiation.

Only exemplary embodiments of the present invention are shown and described in the present disclosure. It is to be understood that the present invention is capable of use in various other combinations and environments and is capable of changes or modifications within the scope of the inventive concept as expressed herein. Such variations are not to be regarded as departure from the spirit and scope of the invention, and all such modifications as would be obvious to one skilled in the art are intended to be included within the scope of the following claims:

The invention claimed is:

1. An optical system comprising:
   a reconfigurable phase-change material (PCM) layer comprising a plurality of individually controllable pixel areas, each individually controllable pixel area being variable between a first refractive index and a second refractive index, the PCM layer being configured to pass radiation incident on the PCM layer in accordance with a first mask pattern through the PCM layer in a downstream direction; and a PCM controller configured to control the plurality of individually controllable pixel areas to have respective refractive indices in accordance with the first mask pattern.

2. The optical system of claim 1, wherein the PCM controller is further configured to, after a period of time, control the plurality of individually controllable pixel areas to have respective refractive indices in accordance with a second mask pattern.

3. The optical system of claim 2, wherein the period of time comprises between about 15 nanoseconds and about 20 nanoseconds.

4. The optical system of claim 3, wherein the PCM controller is further configured to control the plurality of individually controllable pixel areas to have respective refractive indices in accordance with a sequence of mask patterns, including the first mask pattern, a period of time between each mask pattern of the sequence of mask patterns being between about 15 nanoseconds and about 20 nanoseconds.

5. The optical system of claim 1, further comprising an image plane, and wherein the PCM layer is disposed at the image plane.

6. The optical system of claim 1, further comprising a Fourier plane, and wherein the PCM layer is disposed at the Fourier plane.

7. The optical system of claim 1, wherein each individually controllable pixel area is variable between a range of refractive indices between the first refractive index and the second refractive index.

8. The optical system of claim 1, wherein the PCM controller comprises a voltage source, and wherein to control the plurality of individually controllable pixel areas to have the respective refractive indices in accordance with the first mask pattern the PCM controller is further configured to:

provide one of a first voltage level to set a respective individually controllable pixel area to have the first refractive index and a second voltage level to set the respective individually controllable pixel area to have the second refractive index.

9. The optical system of claim 1, further comprising:

a laser source operably connected to the PCM controller, the laser source configured to, responsive to the PCM controller, provide one of a first laser irradiation to a respective individually controllable pixel area to set the respective individually controllable pixel area to the first refractive index and a second laser irradiation to the respective individually controllable pixel area to set the respective individually controllable pixel area to the second refractive index.

10. The optical system of claim 9, wherein the first laser irradiation comprises a continuous wave (CW) irradiation and the second laser irradiation comprises a pulsed irradiation.

11. The optical system of claim 1 wherein the PCM layer comprises a plurality of superpixels, each superpixel comprising a different set of individually controllable pixel areas of the plurality of individually controllable pixel areas.

12. The optical system of claim 11, wherein the PCM controller is further configured to control each superpixel of the plurality of superpixels to have a particular mask pattern by changing refractive indices of the set of individually controllable pixel areas in each superpixel.

13. The optical system of claim 12, further comprising an infrared photodetector wherein:

each superpixel corresponds to a pixel area of a plurality of pixel areas of the infrared photodetector;

the individually controllable pixel areas having the first refractive index are opaque to infrared radiation; and the individually controllable pixel areas having the second refractive index are transparent to infrared radiation.

14. The optical system of claim 1, wherein the first mask pattern corresponds to an imaging mask for compressive imaging.

15. The optical system of claim 1, further comprising:

a photodetector comprising a plurality of detector elements, wherein the photodetector is configured to generate image data quantifying radiation incident on the plurality of detector elements;

wherein:

the PCM controller is further configured to iteratively control the plurality of individually controllable pixel areas to have respective refractive indices in accordance with a plurality of different mask patterns; and the photodetector is configured to generate different image data quantifying the radiation incident on the plurality of detector elements for each of the plurality of different mask patterns.

16. The optical system of claim 1 wherein each individually controllable pixel area is variable between the first refractive index and the second refractive index in response to a change in a phase of the individually controllable pixel area from a crystalline state to an amorphous state.

* * * * *